United States Patent
Kuo

(10) Patent No.: US 7,808,320 B1
(45) Date of Patent: Oct. 5, 2010

(54) BUFFER AMPLIFIER

(75) Inventor: Hung-Chang Kuo, Tainan County (TW)

(73) Assignee: Himax Technologies Limited, Sinshih Township, Tainan County (TW)

( * ) Notice: Subject to any disclaimer, the term of this patent is extended or adjusted under 35 U.S.C. 154(b) by 0 days.

(21) Appl. No.: 12/499,838

(22) Filed: Jul. 9, 2009

(51) Int. Cl.
*H03F 3/45* (2006.01)

(52) U.S. Cl. ...................... 330/255; 345/100

(58) Field of Classification Search ......... 330/252–261; 345/100
See application file for complete search history.

(56) References Cited

U.S. PATENT DOCUMENTS

2006/0279509 A1\* 12/2006 Milanesi ................ 345/100

\* cited by examiner

*Primary Examiner*—Hieu P Nguyen
(74) *Attorney, Agent, or Firm*—Thomas, Kayden, Horstemeyer & Risley

(57) ABSTRACT

A buffer amplifier includes an input stage circuit, an output stage circuit and a bias circuit, providing a buffered output signal at an output terminal according to an input signal applied to a first input terminal. The input stage circuit generates four control signals in response to the input signal when the logic level of the buffered output signal is opposite to that of the input signal. The output stage circuit includes four output transistors, wherein the first and second output transistor of a first type are provided for discharge in response to a first control signal and a second control signal, and the third and fourth output transistor of a second type are provided for charge in response to a third control signal and a fourth control signal. The bias circuit is used for determining the first, second, third and fourth control signal.

8 Claims, 3 Drawing Sheets

BUFFER AMPLIFIER

BACKGROUND OF THE INVENTION

1. Field of the Invention

The invention relates to a buffer amplifier, and more particularly to a buffer amplifier for use in a source driver of a display panel.

2. Description of the Related Art

Nowadays, flat display panels, such as liquid crystal display (LCD) panels, are widely used in electronic devices due to their characteristics of lightweight, thinness and low power consumption. Generally, gate drivers and source drivers are arranged to drive the liquid crystal display panels through a plurality of gate lines and source lines. The gate drivers provide turn-on voltages to respective gate lines sequentially, and then the source drivers supply gray-level voltages, which are associated with image data to be displayed, to corresponding source lines. Further, a source driver generally comprises an output buffer amplifier to drive each panel load, e.g., a load capacitor of a display panel, to a desired state of charge/discharge according to corresponding gray-level voltages.

However, as the display resolution of the display panel is increased, the increased capacitance of each load capacitor substantially deteriorates the charge/discharge capability of the output buffer amplifier, thereby resulting in an undesirable increase of the rising time and the falling time of the load capacitor. Thus, the degradation of the falling time may negatively influence the transition time required for charging/discharging of the load capacitor.

Accordingly, there is a need in the art for an improved and optimized buffer amplifier for use in a source driver of a large-scale display panel, so as to improve the driving capability of the source driver and shorten the rising time and the falling time required for charging/discharging each load capacitor.

BRIEF SUMMARY OF THE INVENTION

According to an embodiment, the invention provides a buffer amplifier having a first input terminal, a second input terminal and an output terminal comprises an input stage circuit, an output stage circuit and a bias circuit. The output terminal is coupled back to the second input terminal, providing a buffered output signal at the output terminal as according to an input signal applied to the first input terminal. The input stage circuit is coupled between the input terminals and the output terminal for generating a four control signals in response to the input signal when the logic level of the buffered output signal is at a logic level opposite to that of the input signal. The output stage circuit, which is coupled to the input stage circuit, comprises a first output transistor and a second output transistor of a first type and a third output transistor and fourth output transistor of a second type. The first output transistor and the second output transistor comprise sources coupled together to receive a first supply voltage, gates respectively coupled to receive a first control signal and a second control signal, and drains coupled together at the output terminal. The third output transistor and the fourth output transistor comprise sources coupled together to receive a second supply voltage, gates respectively coupled to receive a third control signal and a fourth control signal, and drains coupled together at the output terminal. The bias circuit, which is coupled between the input stage circuit and the output stage circuit, comprises a plurality of current mirror circuits for determining the first, second, third and fourth control signal.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
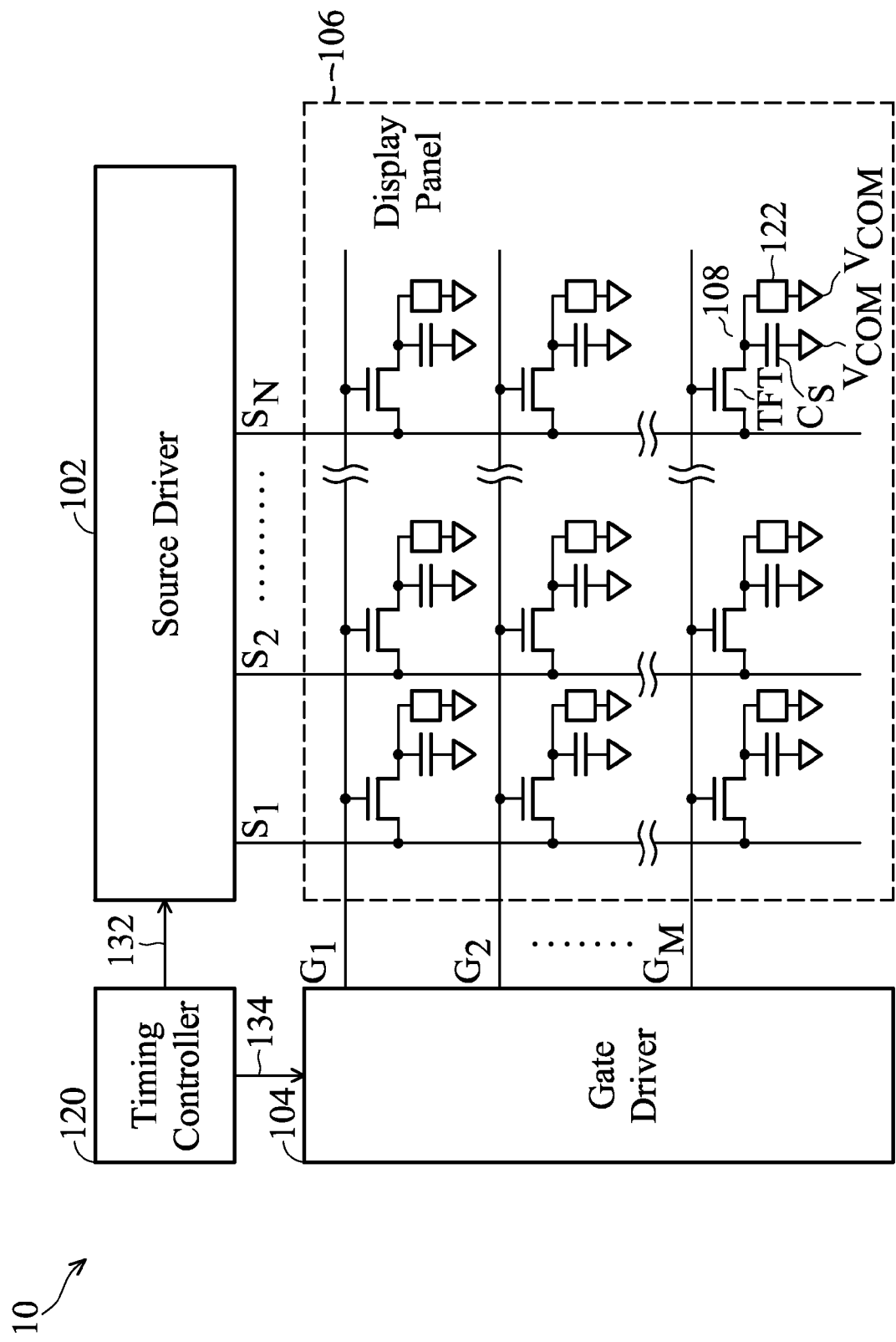
FIG. 1 is a schematic diagram illustrating a display system according to an embodiment of the invention.

FIG. 1 is a schematic diagram illustrating a display system 10 according to an embodiment of the invention.

As shown in FIG. 1, the display system 10 comprises a source driver 102, a gate driver 104, a timing controller 120, and a display panel 106, such as a thin-film transistor liquid crystal display (TFT-LCD) panel. According to this embodiment, the display panel 106 comprises a plurality of display units, e.g., a display unit 108, arranged at intersections by columns of gate lines $G_1, G_2 \ldots G_M$, and rows of source lines $S_1, S_2 \ldots S_N$, to form a display matrix. During operation, the timing controller 120 provides timing signals 132 and 134 respectively for the source driver 102 and the gate driver 104. For example, image data to be displayed is sequentially written to the display units row by row by the source driver 102 in response to the timing signal 132 involving a horizontal clock signal H_clock and a horizontal synchronization signal H_sync provided by the timing controller 120.

In addition, the display unit 108 comprises a liquid crystal unit 122, a thin film transistor TFT, and a storage capacitor $C_S$.

As shown in FIG. 1, the gate and drain of the transistor TFT are respectively connected to a gate line $G_M$ and a source line $S_N$. In this case, the transistor TFT serves as a switch controlled by a turn-on voltage applied from the gate driver 104 to the gate line $G_M$, so as to allow a corresponding gray-level voltage from the source driver 102 to be written into the liquid crystal unit 122. The gray-level voltages are associated with the image data to be displayed. The capacitor $C_S$ functions as a load capacitor for alternatively being charged or discharged in response to a voltage difference between the corresponding gray-level voltage of the source line $S_N$ and a common voltage $V_{COM}$. Further, the capacitor $C_S$ may not be coupled to the common voltage $V_{COM}$ according to other embodiments. The liquid crystal unit 122 is connected in parallel to the capacitor $C_S$. As a result, the liquid crystal unit 122 displays the image data in response to the voltage difference.

Figure 2:
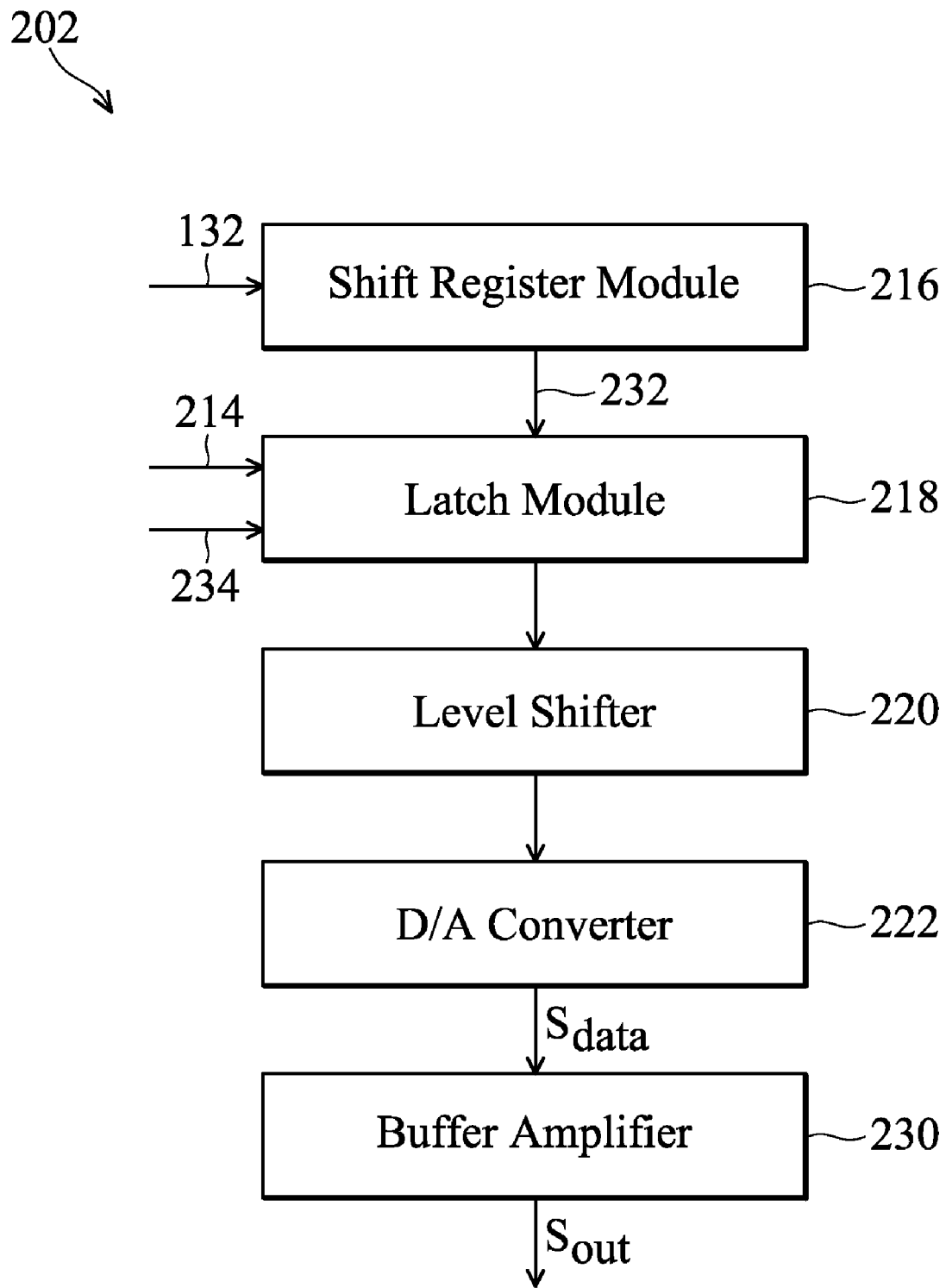
FIG. 2 is a schematic diagram illustrating a source driver according to the embodiment of FIG. 1.

FIG. 2 is a schematic diagram illustrating a source driver 202 according to the embodiment of FIG. 1.

Referring to FIG. 2, the source driver 202 comprises a shift register module 216, a latch module 218, a level shifter 220, a digital-to-analog (D/A) converter 222 and a buffer amplifier 230.

During operation, the shift register module 216 includes a plurality of shift registers for sequentially generating a shift pulse 232 required by a RGB signal 214, which is associated with image data to be displayed, according to the timing signal 132 output from the timing controller 120 as shown in FIG. 1. According to the embodiment, the timing signal 132 includes the horizontal clock signal H_clock and the horizontal synchronization signal H_sync. The latch module 218 includes a set of sample latches for latching the RGB signal 214 in synchronization with the shift pulse 232. Further, the latch module 218 includes a set of hold latches for latching the latched RGB signal 214 in synchronization with a hold signal 234. Next, the level shifter 220 converts the level of the output from the latch module 218 from a digital signal with low voltage to a digital signal with high voltage. Then, the digital-to-analog (D/A) converter 222 generates an analog signal $S_{data}$ based on the digital signal transmitted from the level shifter 220. Following, the analog signal $S_{data}$ is supplied to the buffer amplifier 230. The buffer memory 118 is arranged for receiving the image data to be displayed. The shift register module 116 provides a source line driving signal $S_{input}$ according to the image data from the buffer memory 118 and the timing signal from the timing controller 120. During operation, the shift register module 116 comprises a plurality of shift registers for sequentially outputting a pulse to serve as the source line driving signal $S_{input}$. The buffer amplifier 230 receives the signal $S_{data}$ and generates a buffered output signal $S_{out}$, which may applied to a corresponding source line, such as $S_1, S_2 \ldots S_N$, as shown in FIG. 1.

Specifically, the buffer amplifier 230 is utilized to increases the driving capability of the analog signal $S_{data}$, so as to successfully drive each panel load of the display unit to write the image data to be displayed.

According to an embodiment, the buffered output signal $S_{out}$ is used to drive the display unit 108 in FIG. 1 to a logic level substantially the same as the logic level of the signal $S_{data}$. In this case, the display unit 108 may be at a high logic level, a low logic level or in transition between the logic levels. In particular, for a large-scale or high resolution display panel 106, the buffer amplifier 230 allows the display unit 108 to be charged or discharged more rapidly during a low-to-high or high-to-low transition, so as to improve the falling time characteristics.

Figure 3:
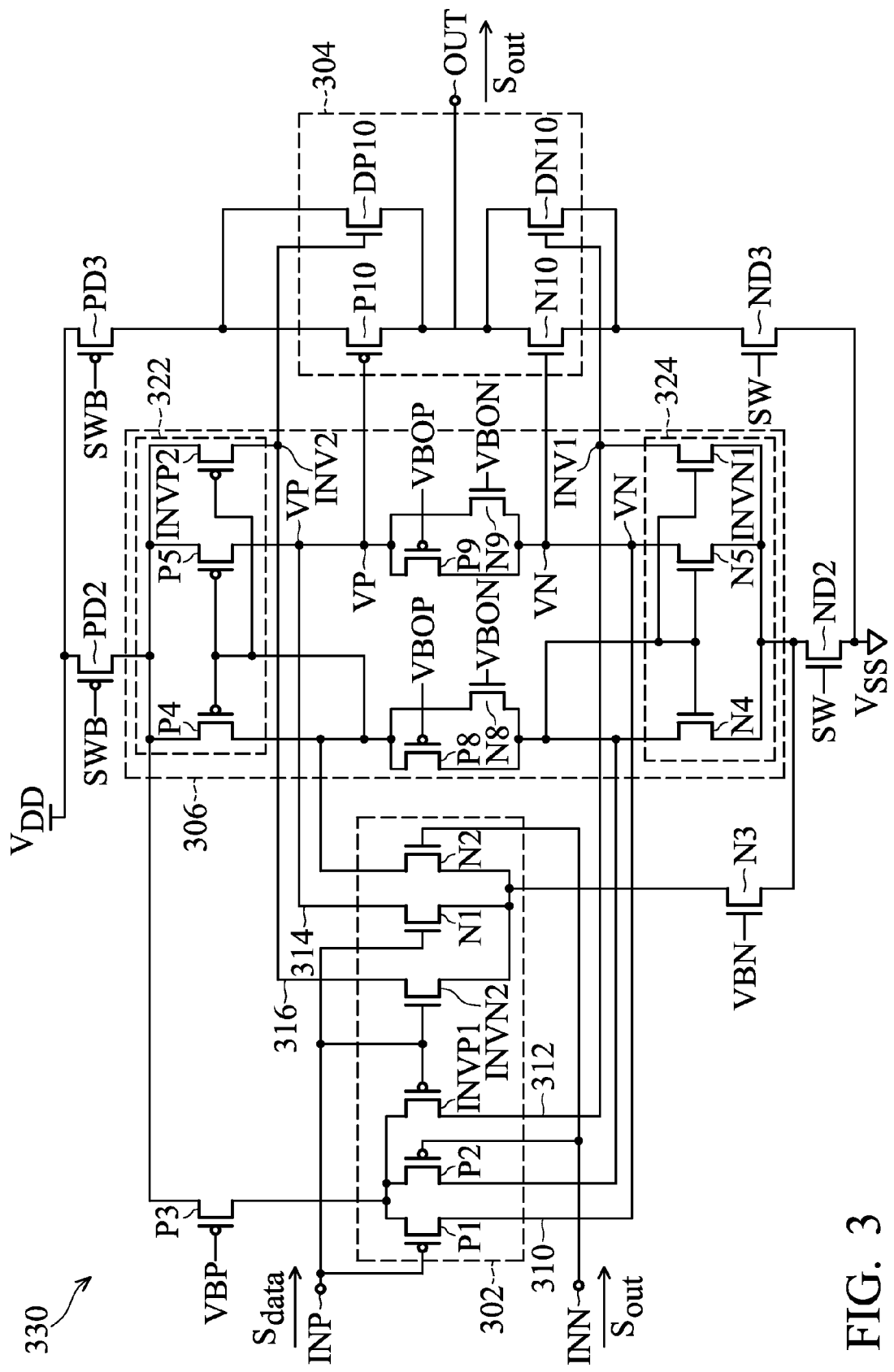
FIG. 3 is a schematic diagram illustrating a buffer amplifier according to the embodiment of FIG. 2.

FIG. 3 is a schematic diagram illustrating a buffer amplifier 330 according to the embodiment of FIG. 2.

Referring to FIG. 3, the buffer amplifier 330 has a first input terminal INP, a second input terminal INN and an output terminal OUT. The output terminal OUT is coupled back to the second input terminal INN, providing a buffered output signal $S_{out}$ at the output terminal OUT as according to a signal $S_{data}$ applied to the first input terminal INN.

In this illustrated embodiment, the buffer amplifier 330 comprises an input stage circuit 302, an output stage circuit 304 and a bias circuit 306. Note that the buffer amplifier 330 is configured to function as a unity-gain buffer amplifier, i.e., the buffered output signal $S_{out}$ is substantially equal to the signal $S_{data}$, so as to economize unnecessary driving power.

As shown in FIG. 3, the input stage circuit 302 is coupled between the two input terminals INP and INN, and the output terminal OUT. When the logic level of the buffered output signal $S_{out}$ at the output terminal OUT is at a logic level opposite to that of the signal $S_{data}$ at the first input terminal INP, the input stage circuit 302 generates four control signals 310, 312, 314 and 316 in response to the signal $S_{data}$ of the first input terminal INP.

Further, the input stage circuit 302 comprises three input PMOS transistors P1, P2 and INVP1 and three input NMOS transistors N1, N2 and INVN2. During operation, the input transistors P1 and INVP1 are used for respectively operating the output transistors N10 and DN10, and the two input NMOS transistors N1 and INVN2 are used for respectively operating the output transistors P10 and DP10. The sources of the input transistors P1 and INVP1 are coupled together to receive the second supply voltage, e.g., $V_{DD}$, gates thereof are coupled together to receive the signal $S_{data}$, and drains thereof are respectively coupled to the gates of the output transistor N10 and DN10. Similarly, the input transistors N1 and INVN2 comprise drains respectively coupled to the gates of the output transistors P10 and DP10, gates coupled together to receive the signal $S_{data}$, and sources coupled together to receive the first supply voltage, e.g., $V_{SS}$. The sources of the input transistor N2 and P2 are respectively coupled to receive the first and second supply voltage, such as $V_{SS}$ and $V_{DD}$, and the gates thereof are coupled to receive the buffered output signal $S_{out}$ from the second input terminal INN.

It is noted that the input transistors P1 and P2 are of the same size (for example, length to width ratio), which is larger than the input transistor INVP1. In addition, the input transistors N1 and N2 are of the same size, which is larger than the input transistor INVN2.

Moreover, the output stage circuit 304 is coupled to the input stage circuit 302. According to the embodiment of FIG. 3, the output stage circuit 304, which is a class AB-type push-pull amplification stage, has a first output NMOS transistor N10, a second output NMOS transistor DN10, a third output PMOS transistor P10 and a fourth output PMOS transistor DP10.

More specifically, the NMOS transistors N10 and DN10 and the PMOS transistors P10 and DP10 are arranged in a push-pull configuration. In detail, the first and second output transistor N10 and DN10 comprise sources coupled together to receive a first supply voltage, gates respectively coupled to receive the first and second control signal 310 and 312, and drains coupled together at the output terminal OUT. Similarly, the third and fourth output transistor P10 and DP10 comprise sources coupled together to receive a second supply voltage, gates respectively coupled to receive the third and fourth control signal 314 and 316, and drains coupled together at the output terminal OUT.

Note that the first supply voltage defined by a lower-voltage supply rail, e.g., $V_{SS}$ in FIG. 3, is lower than the second supply voltage defined by an upper-voltage supply rail, e.g., $V_{DD}$, so that the buffer amplifier 330 operates on rail-to-rail supply voltages.

Further, according to the illustrated embodiment of FIG. 3, the bias circuit 306 coupled between the input stage circuit 302 and the output stage circuit 304 comprises a first current mirror circuit 322 and a second current mirror circuit 324 for determining the first, second, third and fourth control signal 310, 312, 314 and 316. In this case, the current mirror circuits 322 and 324 are provided to modify the voltage at their respective output terminal.

In analyzing the bias circuit 306, a set of NMOS transistors N4, N5 and INVN1 form the current mirror circuit 324 and another set of PMOS transistors P4, P5 and INVP2 form the current mirror circuit 322. The sources of the transistors N4, N5 and INVN1 are coupled together to receive the first supply voltage, e.g., $V_{SS}$, the gates thereof are coupled together to receive a bias voltage, and the drains thereof are respectively coupled to the drain of the input transistor P2, the drain of the input transistor P1 at an output node VN, and the drain of the input transistor INVP1 at an output node INV1. The sources of the transistors P4, P5 and INVP2 are coupled together to receive the second supply voltage, e.g., $V_{DD}$, the gates thereof are coupled together to receive the bias voltage, and the drains thereof are respectively coupled to the drain of the input transistor N2, the drain of the input transistor N1 at an output node INV2, and the drain of the input transistor INVN2 at an output node VP.

Note that the bias voltage is supplied by a circuit consisting of PMOS transistors P8 and P9 and NMOS transistors N8 and N9 with external input voltages VBOP and VBON, thereby allowing the buffer amplifier 330 to operate over a different voltage range. Further, two transistors P3 and N3 supplied with external input voltages VBP and VBN are used to provide constant bias currents. In one embodiment, four transistors PD2, PD3, ND2 and ND3 may additionally provided as four switches for simultaneously activating or de-activating the input stage circuit 302, the bias circuit 306 and the output stage circuit 304 according to two switch signals SW and SWB.

The detailed operation of the buffer amplifier 330 is described in the following.

According to an embodiment, assuming that the load capacitor of the display unit 108 is fully charged, then the buffered output signal $S_{out}$ of a HIGH logic level at the output terminal OUT is fed to the second input terminal INN. When the signal $S_{data}$ of a relative LOW logic level is being applied to the first input terminal INP, the input transistors P1 and INVP1 are respectively turned ON. Then, the control signals 310 and 312 are respectively modified at the output nodes VN and INV1 according to voltage drops across the transistors N5 and INVN1 coupled thereto. More specifically, the current flows through the transistor N5 is increased, so as to increase the drain-source voltage $V_{DS}$ of the transistor N5. Similarly, the increased current flows through the transistor INVN1 directs the drain-source voltage $V_{DS}$ of the transistor INVN1 to increase substantially. The two output nodes VN and INV1 are pulled high to the HIGH logic level. Accordingly, both of the output transistors N10 and DN10 are turned on to discharge the load capacitor of the display unit 108. Thus, the two discharge paths result in a faster discharge of the load capacitor and improve the falling time characteristics of the buffer amplifier 330. When the logic level of the load capacitor present on the output terminal OUT is gradually changed from HIGH to LOW, i.e., the discharge transition is accomplished, the input transistor P2 is turned on. At this time, because the size of either the input transistor P1 or P2 is substantially larger than the input transistor INVP1, there will be less current flowing through the input transistor INVP1.

According to another embodiment, in the case where the load capacitor of the display unit 108 is being charged, the buffered output signal $S_{out}$ is at the LOW logic level at the output terminal OUT and fed back to the second input terminal INN. The signal $S_{data}$ of the HIGH logic level at the first input terminal INP is activated to turn on the input transistors N1 and INVN2. In this case, the control signals 314 and 316 are respectively adjusted at the output nodes VP and INV2 according to voltage drops across the transistors P5 and INVP2 coupled thereto. More specifically, the input transistors N1 and INVN2 are turned on to increase the current flowing through the transistors P5 and INVP2. At this time, the drain-source voltages $V_{DS}$ of the transistors P5 and INVP2 are increased. Thus, the two output nodes VP and INV2 are pulled low to the LOW logic level due to the increased stored voltage across the transistors P5 and INVP2. Accordingly, both of the output transistors P10 and DP10 are turned on to charge the load capacitor of the display unit 108. As a result, the increased dynamic currents further minimize the rising time characteristics of the buffer amplifier 330. When the logic level of the load capacitor present on the output terminal OUT is gradually changed from LOW to HIGH, i.e., the charge transition is accomplished, the input transistor N2 is turned on. Because the size of either the input transistor N1 or N2 is substantially larger than the input transistor INVN2, there will be less current flowing through the input transistor INVN2.

As such, the buffer amplifier of the invention allows the load capacitor of the display unit to be charged/discharged more quickly during the charge/discharge transition. Thus, for a large-scale or high-resolution display panel, during the transition of the signal $S_{data}$, the falling time and driving capability are significantly improved. Further, the buffer amplifier of the invention can also hinder unnecessary power consumption after the process of charging/discharging the load capacitor is completed.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A buffer amplifier having a first input terminal, a second input terminal, and an output terminal coupled back to the second input terminal, providing a buffered output signal at the output terminal as according to an input signal applied to the first input terminal, comprising:

an input stage circuit coupled between the input terminals and the output terminal for generating four control signals in response to the input signal when the logic level of the buffered output signal is at a logic level opposite to that of the input signal;

an output stage circuit coupled to the input stage circuit, having a first output transistor and a second output transistor of a first type and a third output transistor and fourth output transistor of a second type, wherein the first and second output transistor comprise sources coupled together to receive a first supply voltage, gates respectively coupled to receive a first control signal and a second control signal, and drains coupled together at the output terminal, and wherein the third and fourth output transistor comprise sources coupled together to receive a second supply voltage, gates respectively coupled to receive a third control signal and a fourth control signal, and drains coupled together at the output terminal; and a bias circuit coupled between the input stage circuit and the output stage circuit, having a plurality of current mirror circuits for determining the first, second, third, and fourth control signal.

2. The buffer amplifier as claimed in claim 1, wherein the input stage circuit comprises:

a first input transistor and a second input transistor of the second type, having sources coupled together to receive the second supply voltage, gates coupled together to receive the input signal, and drains respectively coupled to the gate of the first and second output transistor;

a third input transistor and a fourth input transistor of the first type, having sources respectively coupled to the gate of the third and fourth output transistor, gates coupled together to receive the input signal, and drains coupled together to receive the first supply voltage;

a fifth input transistor of the second type, having a drain, a source coupled to receive the second supply voltage and a gate couple to receive the buffered output signal from the second input terminal; and a sixth input transistor of the first type, having a drain, a source coupled to receive the first supply voltage and a gate couple to receive the buffered output signal from the second input terminal.

3. The buffer amplifier as claimed in claim 1, wherein the bias circuit comprises:
  a first set of three transistors of the first type, having sources coupled together to receive the first supply voltage, gates coupled together to receive a bias voltage, and drains respectively coupled to the drain of the first input transistor at a first output node, the drain of the second input transistor at a second output node and the drain of the fifth input transistor; and
  a second set of three transistors of the second type, having sources coupled together to receive the second supply voltage, gates coupled together to receive the bias voltage, and drains respectively coupled to the drain of the third input transistor at a third output node, the drain of the fourth input transistor at a fourth output node and the drain of the sixth input transistor,
  wherein the first and second control signal are respectively modified at the first and second output node according to voltage drops across the transistors coupled thereto, and wherein the third and fourth control signal are respectively modified at the third and fourth output node according to voltage drops across the transistors coupled thereto.

4. The buffer amplifier as claimed in claim 1, further comprising:
  a plurality of switches for simultaneously activating or de-activating the input stage circuit, the bias circuit and the output stage circuit.

5. The buffer amplifier as claimed in claim 1, wherein the first supply voltage defined by a lower-voltage supply rail is lower than the second supply voltage defined by an upper-voltage supply rail.

6. The buffer amplifier as claimed in claim 1, wherein the output stage circuit is a class AB-type amplification stage.

7. The buffer amplifier as claimed in claim 1, wherein the transistor of the first type is an NMOS transistor and the transistor of the second type is a PMOS transistor.

8. The buffer amplifier as claimed in claim 1, wherein the first and fifth input transistor are of the same size, which is larger than the second input transistor, and wherein the third and sixth input transistor are of the same size, which is larger than the fourth input transistor.

* * * * *